(12) United States Patent
Kim et al.

(10) Patent No.: US 10,872,859 B2
(45) Date of Patent: Dec. 22, 2020

(54) SEMICONDUCTOR DEVICE

(71) Applicant: Samsung Electronics Co., Ltd., Suwon-si (KR)

(72) Inventors: Young Hun Kim, Seoul (KR); Jae Seok Yang, Hwaseong-si (KR); Hae Wang Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/381,243

(22) Filed: Apr. 11, 2019

(65) Prior Publication Data

US 2020/0098681 A1 Mar. 26, 2020

(30) Foreign Application Priority Data

Sep. 21, 2018 (KR) .......................... 10-2018-0113739

(51) Int. Cl.
*H01L 23/528* (2006.01)
*H01L 29/417* (2006.01)
*H01L 23/532* (2006.01)

(52) U.S. Cl.
CPC ........ *H01L 23/528* (2013.01); *H01L 23/5329* (2013.01); *H01L 23/53271* (2013.01); *H01L 29/41725* (2013.01)

(58) Field of Classification Search
None
See application file for complete search history.

(56) References Cited

U.S. PATENT DOCUMENTS

| | | | |
|---|---|---|---|
| 8,723,269 B2 | 5/2014 | Rockett | |
| 9,570,395 B1 | 2/2017 | Sengupta et al. | |
| 2006/0157731 A1 | 7/2006 | Husher | |
| 2009/0159561 A1 | 6/2009 | Husher | |
| 2013/0026572 A1* | 1/2013 | Kawa | G06F 30/392 257/347 |
| 2017/0062421 A1* | 3/2017 | Cosemans | H01L 21/76895 |
| 2017/0117411 A1* | 4/2017 | Kim | H01L 21/823821 |
| 2017/0294448 A1 | 10/2017 | Debacker et al. | |
| 2018/0151494 A1* | 5/2018 | Ohtou | H01L 21/823814 |
| 2019/0288004 A1* | 9/2019 | Smith | H01L 27/092 |

FOREIGN PATENT DOCUMENTS

| | | |
|---|---|---|
| JP | 5-121685 B2 | 1/2013 |
| JP | 2015-115451 A | 6/2015 |
| KR | 10-2017-0057820 A | 5/2017 |

* cited by examiner

*Primary Examiner* — Khaja Ahmad
(74) *Attorney, Agent, or Firm* — Harness, Dickey and Pierce, P.L.C.

(57) ABSTRACT

A semiconductor device includes an active region extending in a first direction on a substrate, a buried conductive layer disposed adjacent to the active region on the substrate and extending in the first direction, a gate electrode intersecting the active region and extending in a second direction crossing the first direction, a source/drain layer disposed on the active region on one side of the gate electrode, a gate isolation pattern disposed on the buried conductive layer so as to be disposed adjacent to one end of the gate electrode, and extending in the first direction, and a contact plug disposed on the source/drain layer, electrically connected to the buried conductive layer, and in contact with the gate isolation pattern.

20 Claims, 13 Drawing Sheets

SEMICONDUCTOR DEVICE

CROSS-REFERENCE TO RELATED APPLICATION(S)

This application claims priority to Korean Patent Application No. 10-2018-0113739, filed on Sep. 21, 2018 with the Korean Intellectual Property Office, the entire disclosure of which is herein incorporated by reference.

BACKGROUND

1. Field

Example embodiments relate to a semiconductor device.

2. Description of Related Art

As the demand for high performance, high speed, and multifunctionality in semiconductor devices has increased, the degree of integration of semiconductor devices has increased. To meet the demand for high integration of semiconductor devices, patterns may require a fine width or a fine distance therebetween. Also, to control short channel effects, the semiconductor devices including fin field effect transistors (FinFET) and gate-all-around (GAA) transistors including a channel having a three-dimensional structure have been proposed.

SUMMARY

At least some example embodiments are related to a semiconductor device having a standard cell structure including a buried power rail to increase a degree of integration thereof.

According to an example embodiment, a semiconductor device includes an active region extending in a first direction on a substrate; a buried conductive layer extending in the first direction on the substrate such that the buried conductive layer is adjacent to the active region; a gate electrode extending in a second direction crossing the first direction such that the gate electrode intersects the active region; a source/drain layer on the active region on one side of the gate electrode; a gate isolation pattern extending in the first direction on the buried conductive layer, the gate isolation pattern being adjacent to one end of the gate electrode; and a contact plug on the source/drain layer and extending to electrical connect to the buried conductive layer, the contact plug being in contact with the gate isolation pattern.

According to an example embodiment, a semiconductor device includes at least two active regions including a first active region and a second active region, each of the at least two active regions extending in a first direction on a substrate; at least two gate electrodes including a first gate electrode and a second gate electrode, each of the at least two gate electrodes extending in a second direction crossing the first direction such that the at least two gate electrodes are adjacent to each other in the second direction; a gate isolation pattern extending in the first direction between the first gate electrode and the second gate electrode; a buried conductive layer extending in the first direction below the gate isolation pattern; at least two source/drain layers including a first source/drain layer and a second source/drain layer on the first active region and the second active region, respectively; and at least two contact plugs including a first contact plug and a second contact plug on the first source/drain layer and the second source/drain layer, respectively, at least one of the first contact plug and the second contact plug being in contact with the gate isolation pattern while having a laterally asymmetric shape in the second direction.

According to an example embodiment, a semiconductor device includes a gate structure on a substrate; a source/drain layer on one side of the gate structure; a buried conductive layer lower than the source/drain layer relative to the substrate; a gate isolation pattern on the buried conductive layer, the gate isolation pattern being in contact with the gate structure; and a contact plug on the source/drain layer, the contact plug being in contact with the gate isolation pattern, the contact plug extending to the buried conductive layer while covering one end of the source/drain layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concepts will be described with reference to the accompanying drawings.

Figure 1:
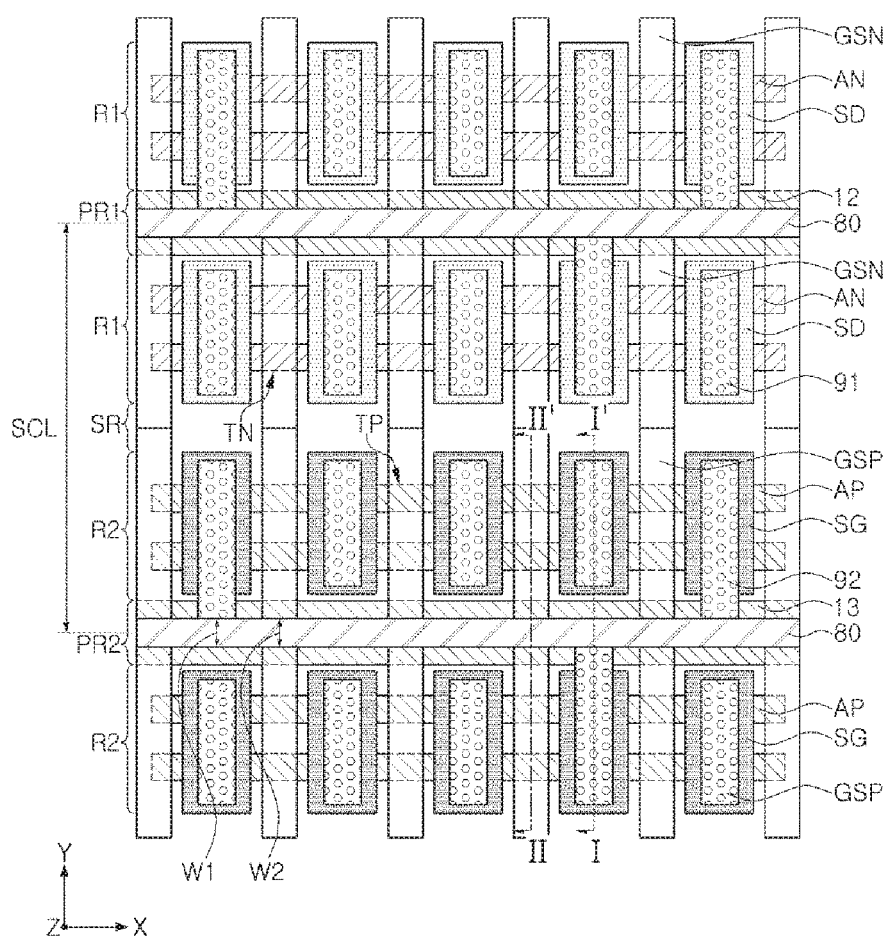
FIG. 1 is a plan view illustrating a semiconductor device according to an example embodiment of the present inventive concepts.
Figure 2:
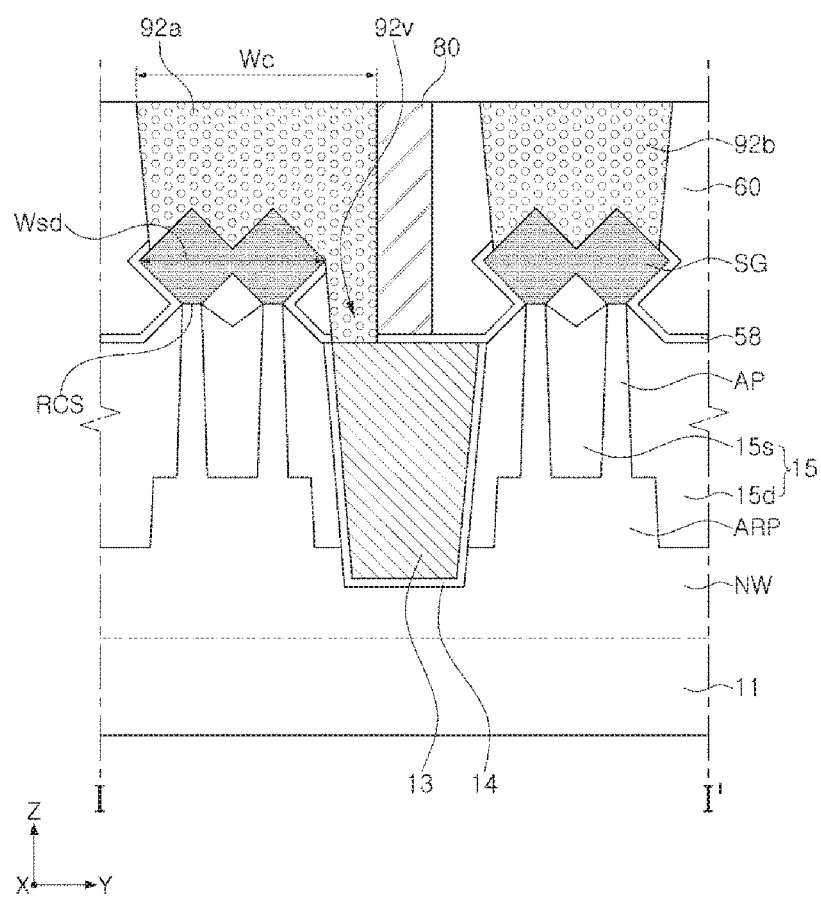
FIG. 2 and FIG. 3 are cross-sectional views of a semiconductor device taken along lines I-I' and II-II' of FIG. 1.
Figure 3:
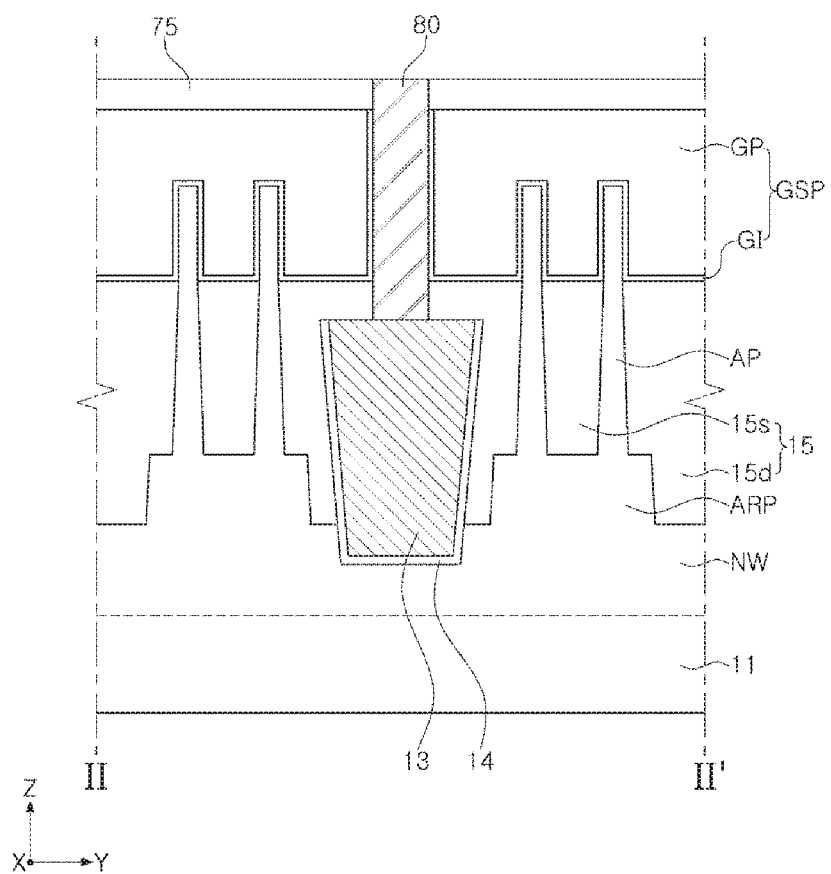

FIG. 1 is a plan view illustrating a semiconductor device according to an example embodiment. FIG. 2 and FIG. 3 are cross-sectional views of a semiconductor device taken along lines I-I' and II-II' of FIG. 1.

With reference to FIG. 1, a semiconductor device according to an example embodiment may include logic standard cells SCL provided on a substrate. Each of the logic standard cells SCL may include a first device region R1; a second device region R2; an isolation region SR located between the first device region R1 and the second device region R2; a first power rail region PR1 adjacent to the first device region R1; and a second power rail region PR2 adjacent to the second device region R2.

N-type transistors TN may be disposed in the first device region R1, and p-type transistors TP may be disposed in the second device region R2. The n-type transistors TN and the p-type transistors TP may be Fin Field-effect transistors (FinFET).

In the first device region R1, p-type active regions AN may extend in a first direction (an X direction), gate structures GSN may extend in a second direction (a Y direction) to intersect the p-type active regions AN, n-type source/drain layers SD may be disposed on the p-type active regions AN between the gate structures GSN, and contact plugs 91 may be disposed on the n-type source/drain layers SD.

In the second device region R2, n-type active regions AP may extend in the first direction (the X direction), gate structures GSP may extend in the second direction (the Y direction) to intersect the n-type active regions AP, p-type source/drain layers SG may be disposed on the n-type active regions AP between the gate structures GSP, and contact plugs 92 may be disposed on the p-type source/drain layers SG.

As an example, two p-type active regions AN are illustrated in the first device region R1, two n-type active regions AP are illustrated in the second device region R2. The number of the p-type active regions AN and the n-type active regions AP may be varied. The p-type active regions AN and the n-type active regions AP may be active fins or fin-type active regions protruding from a substrate.

The n-type transistor TN may include a p-type active region AN, a gate structure GSN, and an n-type source/drain layer SD, and the p-type transistor TP may include an n-type active region AP, a gate structure GSP, and a p-type source/drain layer SG.

The gate structures GSN and the gate structures GSP may be in contact with each another in the isolation region SR. In a manner different from that illustrated in FIG. 1, in one example embodiment, gate isolation patterns locally disposed between a portion of the gate structures GSN and a portion of the gate structures GSP may be further included in the isolation region SR.

In a first power rail region PR1, a first buried conductive layer 12 may be disposed extending in the first direction (the X direction) in parallel to the p-type active regions AN, and in a second power rail region PR2, a second buried conductive layer 13 may be disposed extending in the first direction (the X direction) in parallel to the n-type active regions AN. The first buried conductive layer 12 may be disposed between the p-type active regions AN in the second direction (the Y direction), and the second buried conductive layer 13 may be disposed between the n-type active regions AP in the second direction (the Y direction). The first buried conductive layer 12 and the second buried conductive layer 13 may provide a power voltage or a ground voltage. For example, the first buried conductive layer 12 may provide a power voltage, and the second buried conductive layer 13 may provide a ground voltage. The first buried conductive layer 12 may be referred to as a first buried power rail, and the second buried conductive layer 13 may be referred to as a second buried power rail. In the first and second power rail regions PR1 and PR2, gate isolation patterns 80 may be disposed to overlap the first and second buried conductive layers 12 and 13. The gate isolation patterns 80 may have a width less than a width of each of the first and second buried conductive layers 12 and 13.

The gate isolation patterns 80 may be extended continuously in the first direction (the X direction). The gate isolation patterns 80 may be disposed between the gate structures GSN and between the gate structures GSP in the second direction (the Y direction). One ends of the gate structures GSN may be in contact with the gate isolation pattern 80 in the first power rail region PR1, and one ends of the gate structures GSP may be in contact with the gate isolation pattern 80 in the second power rail region PR2.

Contact plugs 91 may be disposed on the n-type source/drain layers SD, and contact plugs 92 may be disposed on the p-type source/drain layers SG. The contact plugs 91 may be electrically connected to the n-type source/drain layers SD, and the contact plugs 92 may be electrically connected to the p-type source/drain layers SG. A portion of the contact plugs 91 may be extended further than the n-type source/drain layers SD. A portion of the contact plugs 91 may extend to the first power rail region PR1 to be in contact with the gate isolation pattern 80 and in contact with the first buried conductive layer 12, thereby being electrically connected thereto. A portion of the contact plugs 92 may be extended further than the p-type source/drain layers SD. A portion of the contact plugs 92 may extend to the second power rail region PR2 to be in contact with the gate isolation pattern 80 and in contact with the second buried conductive layer 13, thereby being electrically connected thereto.

The first buried conductive layer 12 and the second buried conductive layer 13 may be disposed below the gate isolation patterns 80.

The gate isolation patterns 80 may include a first portion contacting the contact plugs 91 and 92, and a second portion contacting the gate structures GSN and GSP. The first portion may have a first width W1, and the second portion may have a second width W2. The first width W1 and the second width W2 may be identical. In an example embodiment, the first width W1 may be greater than the second width W2. In an example embodiment, the first width W1 may be less than the second width W2.

With reference to FIG. 2 and FIG. 3, the semiconductor device may include a substrate 11 including an n-type well region NW, n-type lower active regions ARP disposed on the n-type well region NW, n-type active regions AP protruding from the n-type lower active regions ARP, a device isolation layer 15 disposed between the n-type lower active regions ARP and the n-type active regions AP, gate structures GSP surrounding upper portions of the n-type active regions AP, a gate isolation pattern 80 disposed between the gate structures GSP, a buried conductive layer 13 disposed below the gate isolation pattern 80 and between the n-type active regions AP, p-type source/drain layers SG disposed on the n-type active regions AP, and contact plugs 92a and 92b disposed on the p-type source/drain layers SG. The gate structures GSP may include a gate insulation layer GI and a gate electrode GP. On the gate structure GSP, a gate capping layer 75 may be disposed. The device isolation layer 15 may include a first isolation layer 15s disposed between the n-type active regions AP, and a second isolation layer 15d disposed between the n-type lower active regions ARP.

The substrate 11 may include a group IV semiconductor, a group III-V compound semiconductor, or a group II-VI compound semiconductor. For example, the group IV semiconductor may include silicon, germanium, or silicon-germanium. According to example embodiments, the substrate 11 may be a silicon-on-insulator (SOI) substrate or a germanium-on-insulator (GOI) substrate.

The n-type well region NW, the n-type lower active region ARP, and the n-type active region AP may include n-type dopants. For example, when the substrate 11, the n-type lower active region ARP, and the n-type active region AP are formed of group IV semiconductors, the n-type dopant may be phosphorus (P) or arsenic (As).

The n-type active regions AP may extend in the first direction (a X direction), and the gate structures GSP may surround upper portions of the n-type active regions AP, protruding upwardly from the device isolation layer 15, and may extend in the second direction (a Y direction) crossing the first direction (the X direction).

The gate isolation pattern 80 may be disposed between the gate structures GSP adjacent to each other in the second direction (the Y direction), and may extend in the first direction (the X direction). One ends of the gate structures GSP may be in contact with the gate isolation pattern 80. The gate isolation pattern 80, for example, may be formed of silicon nitride, silicon oxynitride, or combinations thereof.

The gate structure GSP may include the gate insulation layer GI and the gate electrode GP, and the gate insulation layer GI may be disposed between upper portions of the n-type active regions AP and the gate electrode GP, between the device isolation layer 15 and the gate electrode GP, and between a sidewall of the gate isolation pattern 80 and the gate electrode GP. An interfacial insulating layer may be disposed between the n-type active regions AP and the gate insulation layer GI. The interfacial insulating layer may include silicon oxide.

The gate insulation layer GI may include silicon oxide, silicon nitride, silicon oxynitride, or a high-k material. The high-k material may mean a dielectric material having a higher dielectric constant than that of a silicon oxide (SiO2) film. The high-k material, for example, may be one of aluminum oxide (Al2O3), tantalum oxide (Ta2O3), titanium oxide (TiO2), yttrium oxide (Y2O3), zirconium oxide (ZrO2), zirconium silicon oxide (ZrSixOy), hafnium oxide (HfO2), hafnium silicon oxide (HfSixOy), lanthanum oxide (La2O3), lanthanum aluminum oxide (LaAlxOy), lanthanum hafnium oxide (LaHfxOy), hafnium aluminum oxide (HfAlxOy), and praseodymium oxide (Pr2O3).

The gate electrodes GP may be formed by a plurality of layers stacked on the gate insulation layer GI. At least portions of the plurality of layers may be formed of different materials from each another. The gate electrodes GP may include, for example, TiN, TaN, WN, WCN, TiAl, TiAlC, TiAlN, aluminum (Al), tungsten (W), copper (Cu), molybdenum (Mo), doped polysilicon, or combinations thereof.

The second buried conductive layer 13 may be disposed below the gate isolation pattern 80 and extend in the first direction (the X direction). The second buried conductive layer 13 may have a width greater than a width of the gate isolation pattern 80 in the second direction (the Y direction). The second buried conductive layer 13 may be disposed between the n-type active regions AP, and may be buried in the device isolation layer 15. A lower portion of the second buried conductive layer 13 may be inserted into the substrate 11. An insulating layer 14 may be disposed between the second buried conductive layer 13 and the substrate 11. The insulating layer 14 may extend on sidewalls of the second buried conductive layer 13. The second buried conductive layer 13 may have an inclined sidewall with respect to an upper surface of the substrate 11, and may have an upper portion having a width that is greater than a width of a lower portion of the second buried conductive layer 13. The second buried conductive layer 13 may include, for example, TiN, TaN, WN, WCN, TiAl, TiAlC, TiAlN, aluminum (Al), tungsten (W), copper (Cu), molybdenum (Mo), doped polysilicon, or combinations thereof.

The p-type source/drain layers SG may be disposed on recess regions RCS of the n-type active regions AP and extend in the second direction (the Y direction). The p-type source/drain layers SG may be formed integrally on the n-type active regions AP disposed on one n-type lower active region ARP, and may have inclined upper surfaces. An upper surface of the second buried conductive layer 13 may be disposed to be lower than a bottom of the recess region RCS of the n-type active region AP. For example, the second buried conductive layer 13 may be disposed to be lower than lower ends of the p-type source/drain layers SG. The p-type source/drain layers SG may be semiconductor layers including p-type dopants, formed from the recess regions RCS of the n-type active regions AP by selective epitaxial growth.

The contact plugs 92a and 92b may be disposed on the p-type source/drain layers SG and extend in the second direction (the Y direction). Of the contact plugs 92a and 92b, for example, a first contact plug 92a located on one side of the gate isolation pattern 80 may be extended further than the p-type source/drain layers SG. A length We of the first contact plug 92a may be greater than a length Wsd of the p-type source/drain layers SG. One ends of the p-type source/drain layers SG may be spaced apart from the gate isolation pattern 80, and one end of the first contact plug 92a may be in contact with the gate isolation pattern 80.

The first contact plug 92a may have a laterally asymmetric shape at a cross-section taken in the second direction (the Y direction). The first contact plug 92a may include a contact portion 92v that extends to the second buried conductive layer 13 while covering one end of the p-type source/drain layer SG. The first contact plug 92a may be electrically connected to the second buried conductive layer 13 by the contact portion 92v. The second contact plug 92b may have a laterally symmetric shape at a cross-section taken in the second direction (the Y direction). A lower surface of the second contact plug 92b may be in contact only with an upper surface of the p-type source/drain layer SG.

The contact plugs 92a and 92b may include, for example, TiN, TaN, WN, WCN, TiAl, TiAlC, TiAlN, aluminum (Al), tungsten (W), copper (Cu), molybdenum (Mo), doped polysilicon, or combinations thereof.

An etch stop layer 58 may be disposed on a surface of a portion of the p-type source/drain layer SG, and the etch stop layer 58 may extend onto the device isolation layer 15. The etch stop layer 58 may cover a portion of an upper surface of the second buried conductive layer 13. An interlayer insulating layer 60 may be disposed on the etch stop layer 58. The contact plugs 92a and 92b may pass through the interlayer insulating layer 60 and extend to the p-type source/drain layers SG. The etch stop layer 58 may include a silicon nitride layer or a silicon oxynitride layer. The interlayer insulating layer 60 may include a silicon oxide layer.

The gate capping layer 75 may be disposed on the gate structures GSP. The gate capping layer 75 may include at least one of silicon oxide, silicon nitride, and silicon oxynitride.

Figure 4:
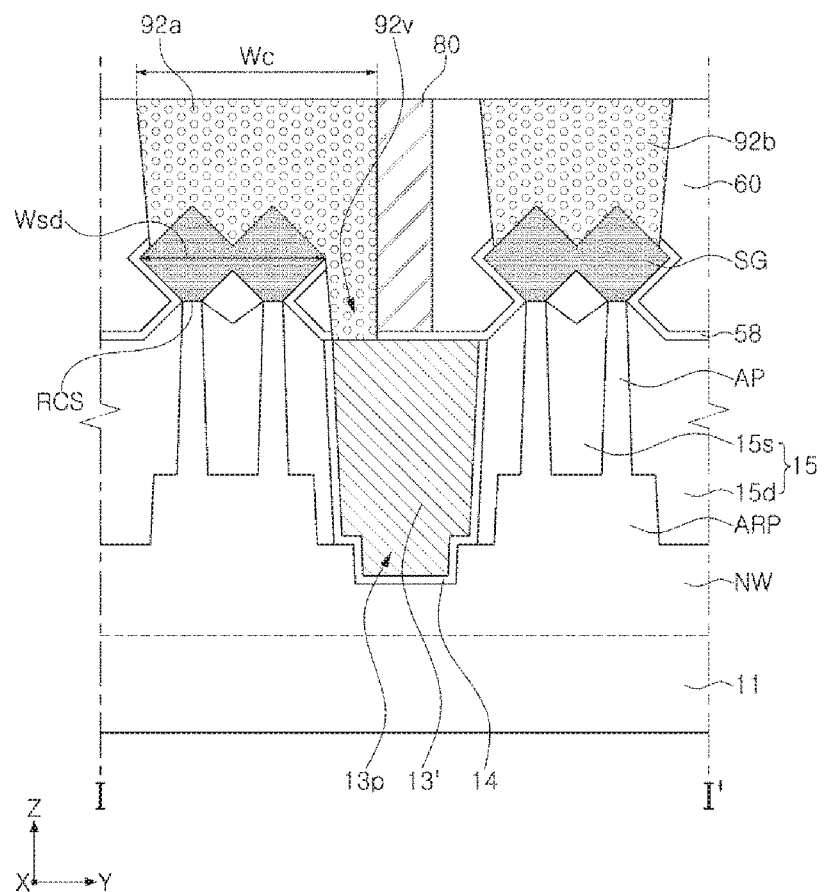
FIGS. 4 to 7 are cross-sectional views of a semiconductor device according to example embodiments of the present inventive concepts.
Figure 5:
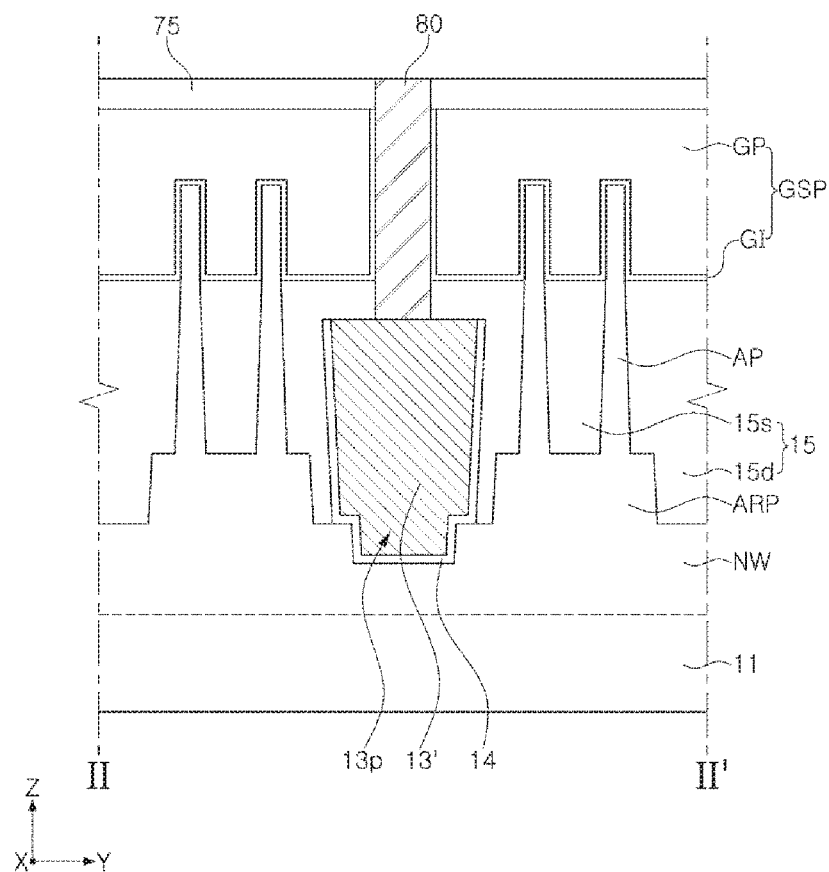
Figure 6:
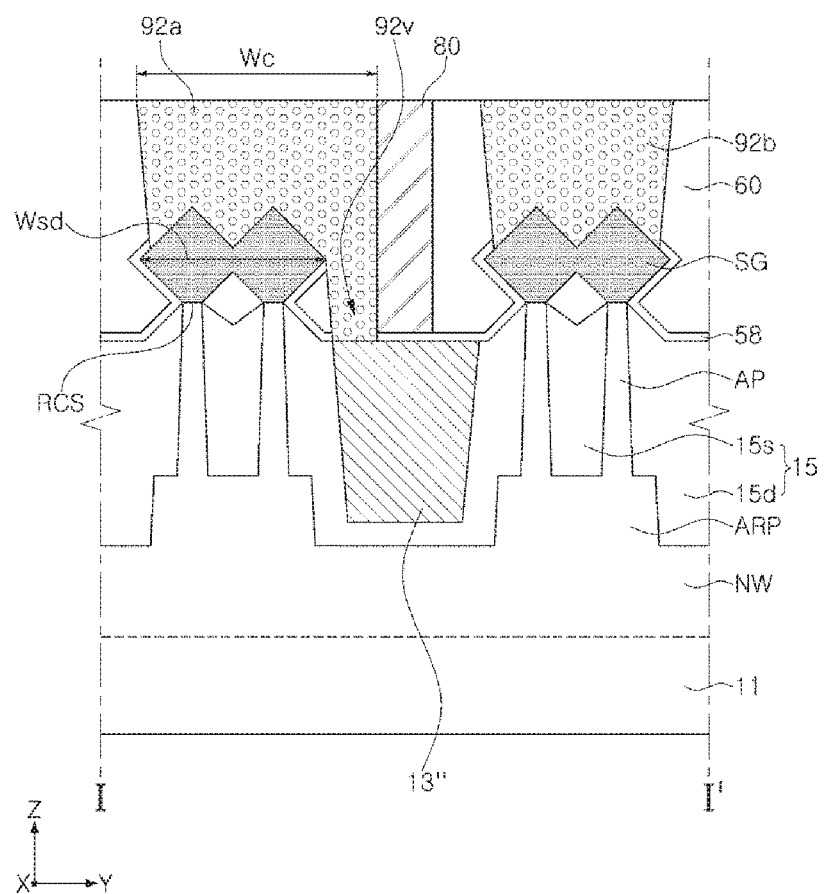
Figure 7:
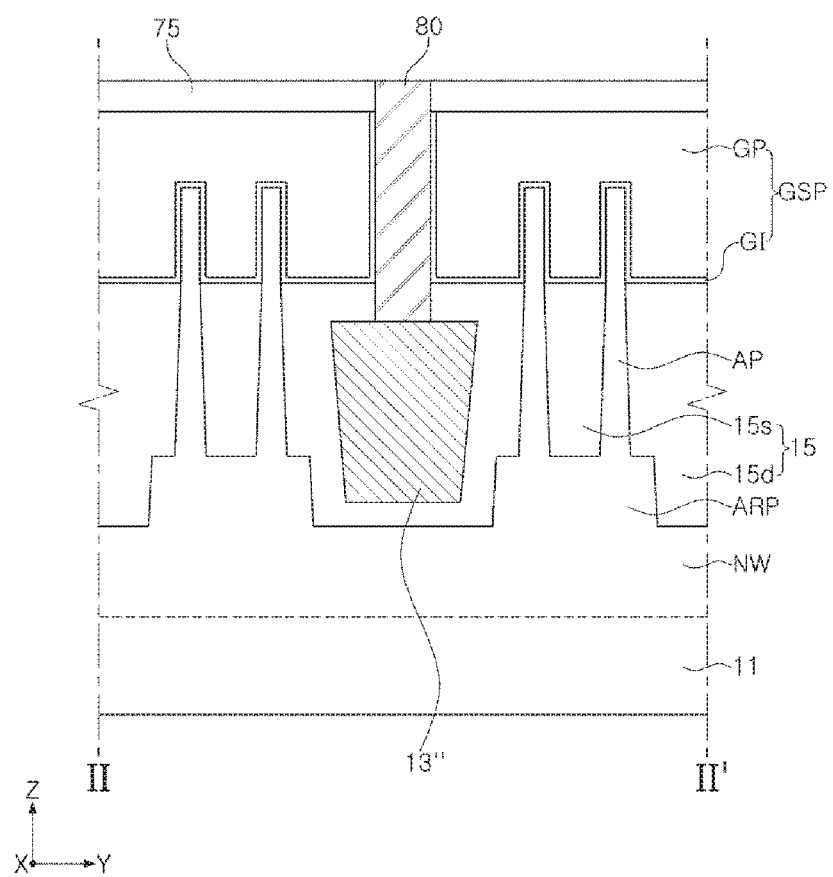

FIGS. 4 to 7 are cross-sectional views illustrating a semiconductor device according to example embodiments. FIGS. 4 and 6 are cross-sectional views corresponding to FIG. 2, and FIGS. 5 and 7 are cross-sectional views corresponding to FIG. 3. Since example embodiments of FIG. 4 to FIG. 7 are similar to the example embodiment of FIG. 1 to FIG. 3, the explanation will be given with emphasis placed upon differences.

With reference to FIG. 4 and FIG. 5, unlike FIG. 2 and FIG. 3, a second buried conductive layer 13' may have a protruding portion 13p inserted into the substrate 11, and the protruding portion 13p may have a width less than that of a lower portion of the second buried conductive layer 13' disposed on the substrate 11.

With reference to FIG. 6 and FIG. 7, unlike FIG. 2 and FIG. 3, a second buried conductive layer 13" may not be inserted into the substrate 11, and a lower surface of the second buried conductive layer 13" may be disposed to be higher than an upper surface of the substrate 11. Between a lower surface of the second buried conductive layer 13" and the substrate 11, a device isolation layer 15 may be present to thereby enable electric insulation. Between the substrate 11 and the second buried conductive layer 13", there is no need for an insulating layer 14 to be disposed.

Figure 8:
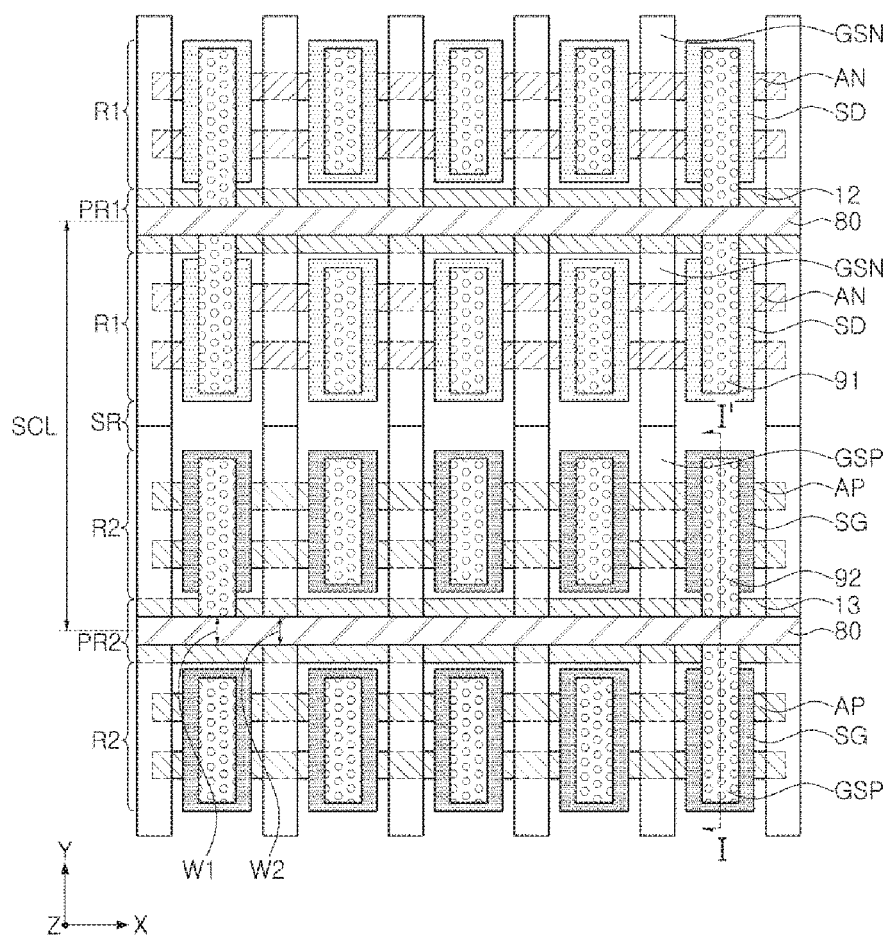
FIG. 8 is a plan view illustrating a semiconductor device according to an example embodiment of the present inventive concepts.
Figure 9:
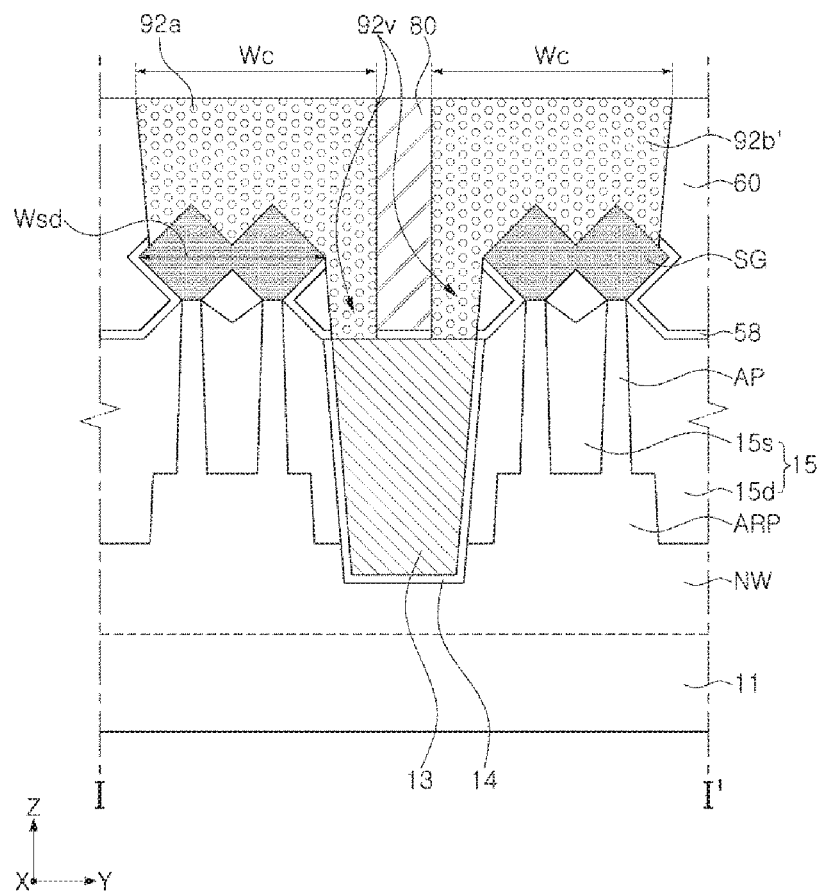
FIG. 9 is a cross-sectional view of a semiconductor device taken along line I-I' of FIG. 8.

FIG. 8 is a plan view illustrating a semiconductor device according to an example embodiment. FIG. 9 is a cross-sectional view of a semiconductor device taken along line I-I' of FIG. 8. FIG. 8 is a plan view corresponding to FIG. 1, and FIG. 9 is a cross-sectional view corresponding to FIG. 2. Since an example embodiment of FIG. 8 and FIG. 9 is similar to the example embodiment of FIG. 1 to FIG. 3, the explanation will be given with emphasis placed upon differences.

With reference to FIG. 8 and FIG. 9, unlike FIG. 2, first and second contact plugs 92a and 92b' that are disposed along the same line in the second direction (a Y direction) at both sides of a gate isolation pattern 80 may be extended further than p-type source/drain layers SG in the second direction. A length We of each of the first and second contact plugs 92a and 92b' may be greater than a length Wsd of each of the p-type source/drain layers SG. One ends of the p-type source/drain layers SG may be spaced apart from the gate isolation pattern 80, and one ends of the first and second contact plugs 92a and 92b' may be in contact with the gate isolation pattern 80. The p-type source/drain layer SG connected to the first contact plugs 92a may be a first source/drain layer, and the p-type source/drain layer SG connected to the second contact plugs 92b' may be a second source/drain layer.

The first and second contact plugs 92a and 92b' may have a laterally asymmetric shape at a cross-section taken in the second direction (the Y direction). The first contact plugs 92a and the second contact plugs 92b' may each include a contact portion 92v that extends to the second buried conductive layer 13 while covering one end of the p-type source/drain layer SG. The first and second contact plugs 92a and 92b' may be electrically connected to the second buried conductive layer 13 by the contact portions 92v. The contact portion 92v of the first contact plug 92a may be a first contact portion, and the contact portion 92v of the second contact plug 92b' may be a second contact portion.

Figure 10:
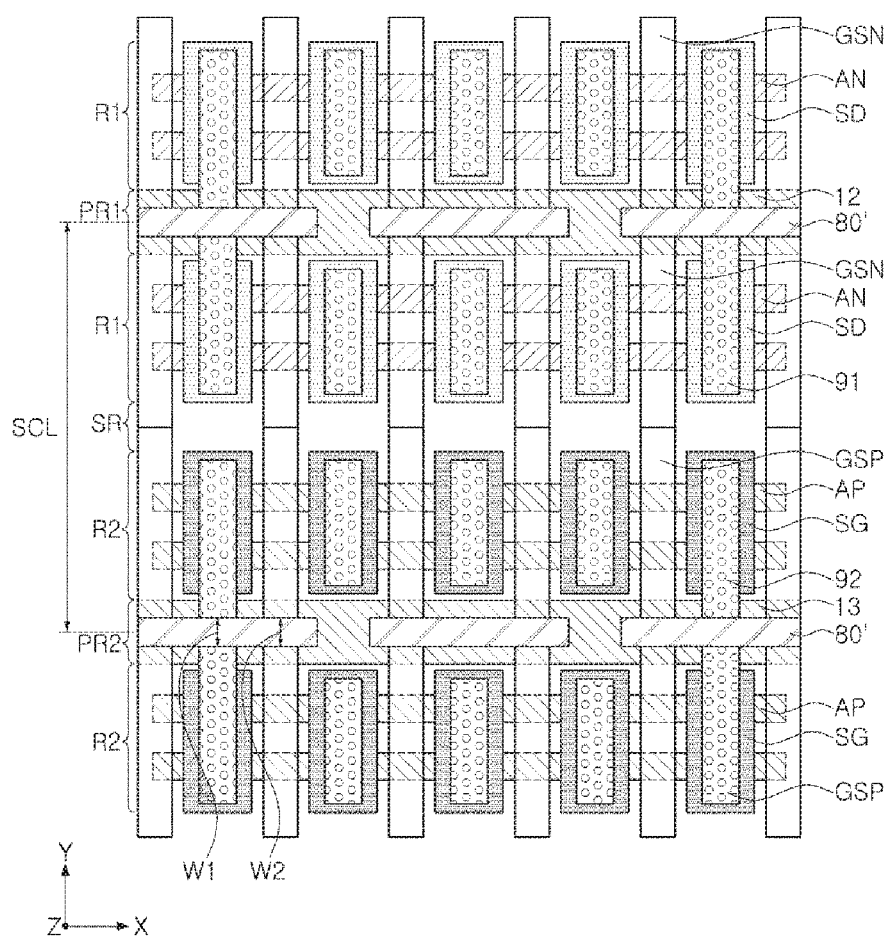
FIG. 10 is a plan view illustrating a semiconductor device according to an example embodiment of the present inventive concepts.

FIG. 10 is a plan view illustrating a semiconductor device according to an example embodiment. Since FIG. 10 is a plan view corresponding to FIG. 1 and is similar to the example embodiment of FIG. 1, the explanation will be given with emphasis placed upon differences.

With reference to FIG. 10, a gate isolation pattern 80' may extend in the first direction (a X direction) by a length less than that of each of buried conductive layers 12 and 13. The gate isolation patterns 80' may be arranged in a single row in first and second power rail regions PR1 and PR2.

One ends of gate structures GSN may be in contact with the gate isolation pattern 80' in the first power rail region PR1, and one ends of gate structures GSP may be in contact with the gate isolation pattern 80' in the second power rail region PR2.

Figure 11:
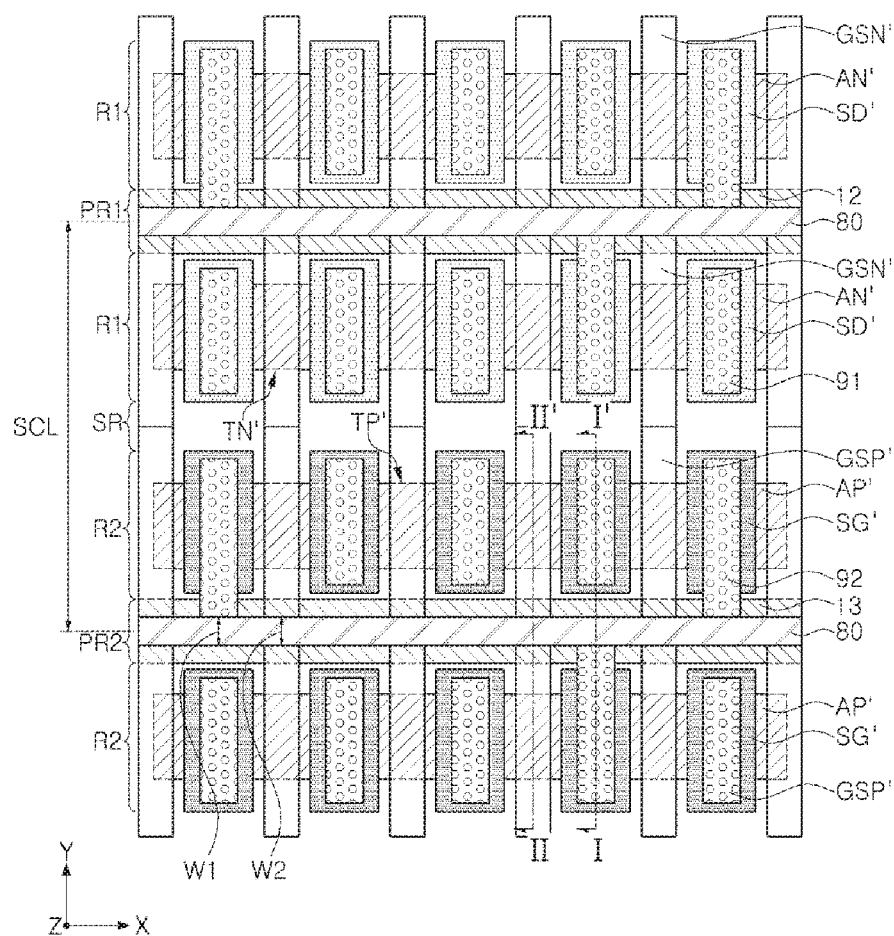
FIG. 11 is a plan view illustrating a semiconductor device according to an example embodiment of the present inventive concepts.
Figure 12:
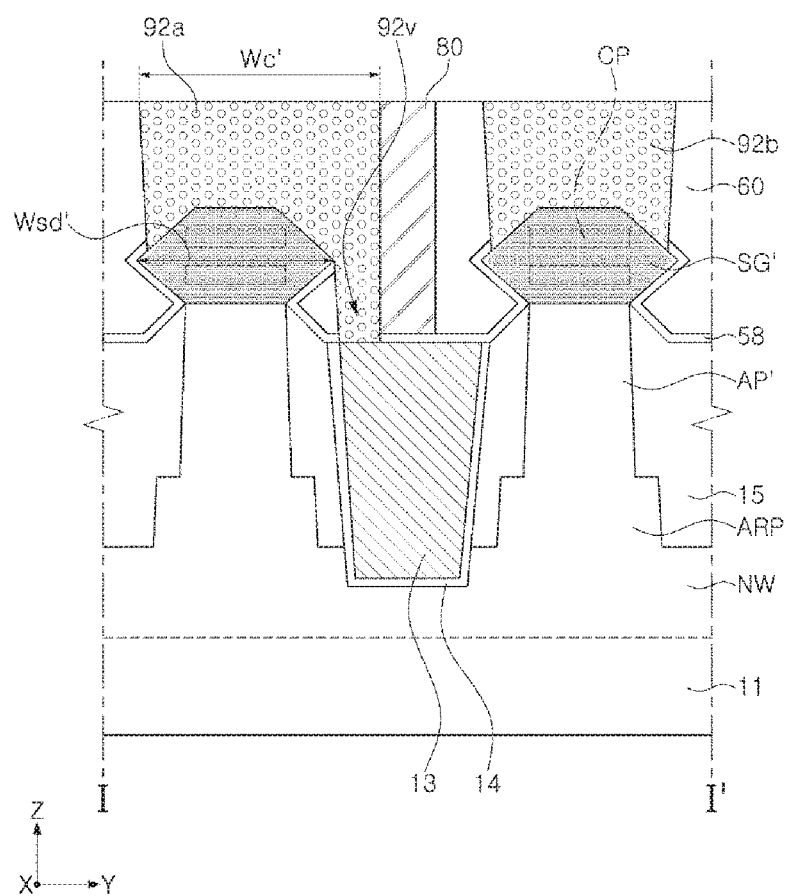
FIG. 12 and FIG. 13 are cross-sectional views of a semiconductor device taken along lines I-I' and II-II' of FIG. 11.
Figure 13:
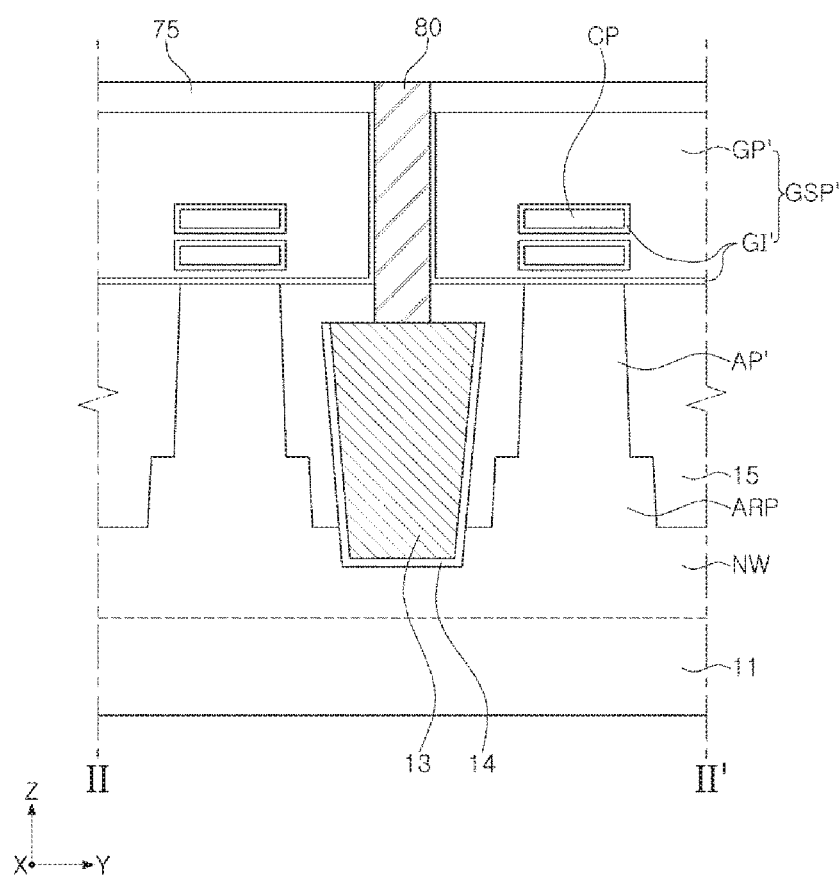

FIG. 11 is a plan view illustrating a semiconductor device according to an example embodiment. FIG. 12 and FIG. 13 are cross-sectional views illustrating a semiconductor device taken along lines I-I' and II-II' of FIG. 11. Since an example embodiment of FIG. 11 to FIG. 13 is similar to the example embodiment of FIG. 1 to FIG. 3, the explanation will be given with emphasis placed upon differences.

With reference to FIG. 11, n-type transistors TN' may be disposed in a first device region R1, and p-type transistors TP' may be disposed in a second device region R2. The n-type transistors TN' and the p-type transistors TP' may be Gate-All-Around (GAA) Field Effect transistors.

In the first device region R1, a p-type active region AN' may extend in the first direction (a X direction), gate structures GSN' may extend in the second direction (a Y direction) so as to intersect the p-type active region AN', n-type source/drain layers SD' may be disposed on the p-type active region AN' between the gate structures GSN', and contact plugs 91 may be disposed on the n-type source/drain layers SD'. p-type channel layers may dispose above the p-type active regions AN' while being spaced apart from each other and apart from the p-type active regions AN'. The gate structures GSN' may surround the p-type channel layers CN.

In the second device region R2, an n-type active region AP' may extend in the first direction (the X direction), gate structures GSP' may extend in the second direction (the Y direction) so as to intersect the n-type active region AP', p-type source/drain layers SG' may be disposed on the n-type active region AP' between the gate structures GSP', and contact plugs 92 may be disposed on the p-type source/drain layers SG'. n-type channel layers may dispose above the n-type active regions AP' while being spaced apart from each other and apart from the n-type active regions AP'. The gate structures GSP' may surround the n-type channel layers CP.

With reference to FIG. 12 and FIG. 13, the semiconductor device may include a substrate 11 in which an n-type well region NW is formed, n-type lower active regions ARP disposed on the n-type well region NW, n-type active regions AP' protruding from the n-type lower active regions ARP, a device isolation layer 15 disposed between the n-type lower active regions ARP and the n-type active regions AP', n-type channel layers CP disposed above the n-type active regions AP' while being spaced apart from each other and apart from the n-type active regions AP', gate structures GSP' surrounding the n-type channel layers CP, a gate isolation pattern 80 disposed between the gate structures GSP', a buried conductive layer 13 disposed below the gate isolation pattern 80 and between the n-type active regions AP', p-type source/drain layers SG' disposed on the n-type active regions AP', and contact plugs 92a and 92b disposed on the p-type source/drain layers SG'.

The n-type active regions AP' may extend in the second direction (a Y direction), and the n-type channel layers CP may extend in the second direction (the Y direction) by the same length as the n-type active regions AP'.

The p-type source/drain layers SG' may be in contact with the n-type channel layers CP.

The gate structures GSP' may extend in the second direction (a Y direction) while surrounding the n-type channel layers CP.

The gate isolation pattern 80 may be disposed between gate structures GSP' adjacent to each other in the second direction (the Y direction), and may extend in the first direction (the X direction). One ends of the gate structures GSP' may be in contact with the gate isolation pattern 80.

The gate structures GSP' may include a gate insulation layer GI' and a gate electrode GP', and the gate insulation layer GI' may be disposed between upper portions of the n-type active regions AP and the gate electrode GP', between the device isolation layer 15 and the gate electrode GP', and between a sidewall of the gate isolation pattern 80 and the gate electrode GP'. Further, the gate insulation layer GI' may be additionally disposed between the n-type channel layers CP and the gate electrode GP'. An interfacial insulating layer may be disposed between the n-type active regions AP' and the gate insulation layer GI' and between the n-type channel layers CP and the gate electrode GP'.

The contact plugs 92a and 92b may be disposed on the p-type source/drain layers SG' and may extend in the second direction (the Y direction). Of the contact plugs 92a and 92b, for example, a first contact plug 92a located on one side of the gate isolation pattern 80 may be extended further than the p-type source/drain layers SG'. A length Wc' of the first contact plug 92a may be greater than a length Wsd' of each of the p-type source/drain layers SG'.

A gate capping layer 75 may be disposed on the gate structures GSP'.

Although cross-sectional structures of the second device region R2 and the second power rail region PR2 have been explained above, the first device region R1 and the first power rail region PR1 may also have cross-sectional structures similar thereto.

As set forth above, according to example embodiments, a semiconductor device with improved contact resistance characteristics between the source/drain layer SG and the buried conductive layer 13, 13', 13" may be obtained by electrically connecting the source/drain layer SG and the buried conductive layer 13, 13', 13" through the contact plug 92 that self-aligns by the gate isolation pattern 80, 80'.

While example embodiments have been shown and described above, it will be apparent to those skilled in the art that modifications and variations could be made without departing from the scope of the present inventive concepts as defined by the appended claims.

What is claimed is:

1. A semiconductor device comprising:
    an active region extending in a first direction on a substrate;
    an isolation layer on a sidewall of the active region;
    a buried conductive layer extending in the first direction on the substrate such that the buried conductive layer is adjacent to the active region;
    a gate electrode extending in a second direction crossing the first direction such that the gate electrode intersects the active region;
    a source/drain layer on the active region on one side of the gate electrode;
    an interlayer insulating layer on the isolation layer, the buried conductive layer and the source/drain layer;
    a gate isolation pattern extending in the first direction on the buried conductive layer, the gate isolation pattern penetrating through the interlayer insulating layer; and
    a contact plug on the source/drain layer, the contact plug including a contact portion extending through the interlayer insulating layer to electrically connect to the buried conductive layer,
        wherein the gate isolation pattern has a first sidewall and a second sidewall opposing each other,
        wherein the contact portion of the contact plug is in contact with a first portion of the first sidewall of the gate isolation pattern,
        wherein one end of the gate electrode faces a second portion of the first sidewall of the gate isolation pattern, and
        wherein the gate isolation pattern directly contacts at least a portion of the buried conductive layer.

2. The semiconductor device of claim 1, wherein the gate isolation pattern extends continuously along the buried conductive layer.

3. The semiconductor device of claim 1, wherein the gate isolation pattern has a line type in plan view perspective and the gate isolation pattern has a length less than a length of the buried conductive layer in the first direction.

4. The semiconductor device of claim 1, wherein the gate isolation pattern includes portions having different widths in the second direction.

5. The semiconductor device of claim 1, wherein the contact plug is configured to self-align on the buried conductive layer via the sidewall of the gate isolation pattern.

6. The semiconductor device of claim 1, further comprising:
    an etch stop layer covering a portion of the source/drain layer and a portion of the buried conductive layer,
    wherein the contact portion covers one end of the source/drain layer and extends to the buried conductive layer and penetrates through the etch stop layer.

7. The semiconductor device of claim 1, wherein
    the active region includes a recess region, the source/drain layer being on the recess region of the active region, and
    an upper surface of the buried conductive layer is lower than a bottom of the recess region of the active region with respect to the substrate.

8. The semiconductor device of claim 1, wherein a lower portion of the buried conductive layer is in the substrate.

9. The semiconductor device of claim 1, wherein
    the buried conductive layer includes an upper portion and a lower portion, the upper portion being higher than the lower portion with respect to the substrate, and
    the buried conductive layer has an inclined sidewall such that a width of the upper portion of the buried conductive layer is greater than a width of the lower portion of the buried conductive layer.

10. The semiconductor device of claim 1, wherein
    the buried conductive layer includes a protruding portion and a lower portion, the lower portion being on the substrate and the protruding portion protruding into the substrate, and
    a width of the protruding portion is less than a width of the lower portion of the buried conductive layer.

11. The semiconductor device of claim 1, wherein a lower surface of the buried conductive layer is higher than an upper surface of the substrate with respect to the substrate.

12. The semiconductor device of claim 1, further comprising:
    an insulating layer between the buried conductive layer and the isolation layer and between the buried conductive layer and the substrate.

13. A semiconductor device comprising:
    at least two active regions including a first active region and a second active region, each of the at least two active regions extending in a first direction on a substrate;
    an isolation layer between the at least two active regions;
    at least two gate electrodes including a first gate electrode and a second gate electrode, each of the at least two gate electrodes extending in a second direction crossing the first direction such that the at least two gate electrodes are adjacent to each other in the second direction;
    a buried conductive layer extending in the first direction on the substrate, the buried conductive layer penetrating through at least a portion of the isolation layer;
    an interlayer insulating layer on the isolation layer, the at least two active regions and the buried conductive layer;

a gate isolation pattern on the buried conductive layer, the gate isolation pattern extending in the first direction between the first gate electrode and the second gate electrode and penetrating through the interlayer insulating layer and including a material different from a material of the interlayer insulating layer;

at least two source/drain layers including a first source/drain layer and a second source/drain layer on the first active region and the second active region, respectively; and at least two contact plugs including a first contact plug and a second contact plug on the first source/drain layer and the second source/drain layer, respectively, the first contact plug and the second contact plug including a first contact portion and a second contact portion, respectively, the first contact portion and the second contact portion each extending through the interlayer insulating layer to electrically connect to the buried conductive layer such that the first contact portion and the second contact portion that each extend to the buried conductive layer are in contact with a sidewall of the gate isolation pattern while having a laterally asymmetric shape in the second direction, wherein the gate isolation pattern directly contacts at least a portion of the buried conductive layer.

14. The semiconductor device of claim 13, wherein the gate isolation pattern extends in the first direction along the buried conductive layer.

15. The semiconductor device of claim 13, wherein the first contact portion covers one end of the first source/drain layer, and the first contact plug is configured to self-align on the buried conductive layer via the sidewall of the gate isolation pattern.

16. The semiconductor device of claim 15, wherein the second contact portion covers one end of the second source/drain layer, and the second contact plug is configured to self-align on the buried conductive layer via the sidewall of the gate isolation pattern.

17. The semiconductor device of claim 13, wherein a lower portion of the buried conductive layer is in the substrate.

18. The semiconductor device of claim 13, wherein a lower surface of the buried conductive layer is higher than an upper surface of the substrate with respect to the substrate.

19. A semiconductor device comprising:

a first active fin and a second active fin on a substrate, the first active fin and the second active fin extending in a first direction;

a first isolation layer between a first sidewall of the first active fin and a second sidewall of the second active fin, the first sidewall and second sidewall facing each other;

a second isolation layer on a third sidewall of the first active fin and on a fourth sidewall of the second active fin, a bottom surface of the second isolation layer at a lower level that a bottom surface of the first isolation layer;

a gate electrode extending in a second direction crossing the first direction such that the gate electrode intersects the first active fin and the second active fin;

a source/drain layer on the first active fin and the second active fin, a portion of the source/drain layer overlapping the first isolation layer;

an interlayer insulating layer on the first isolation layer, the second isolation layer and the source/drain layer;

a buried conductive layer extending in the first direction on the substrate, the buried conductive layer having a bottom surface at a lower level than the bottom surface of the second isolation layer;

a gate isolation pattern on the buried conductive layer, the gate isolation pattern penetrating through the interlayer insulating layer; and a contact plug on the source/drain layer, the contact plug including a contact portion adjacent to the first active fin and extending along a sidewall of the gate isolation pattern to the buried conductive layer and electrically connecting to the buried conductive layer, wherein the first sidewall and the third sidewall of the first active fin are opposite each other and the second sidewall and the fourth sidewall of the second active fin are opposite each other, and wherein the gate isolation pattern directly contacts at least a portion of the buried conductive layer.

20. The semiconductor device of claim 19, further comprising:

an etch stop layer covering a portion of the source/drain layer and a portion of the buried conductive layer; and an insulating layer between the buried conductive layer and the second isolation layer and between the buried conductive layer and the substrate, wherein the contact portion of the contact plug penetrates through the interlayer insulating layer and the etch stop layer.

* * * * *